United States Patent
Jha et al.

(10) Patent No.: US 12,124,230 B2
(45) Date of Patent: Oct. 22, 2024

(54) SYSTEM AND METHOD FOR POLYTOPIC POLICY OPTIMIZATION FOR ROBUST FEEDBACK CONTROL DURING LEARNING

(71) Applicant: Mitsubishi Electric Research Laboratories, Inc., Cambridge, MA (US)

(72) Inventors: Devesh Jha, Cambridge, MA (US); Ankush Chakrabarty, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 317 days.

(21) Appl. No.: 17/643,604

(22) Filed: Dec. 10, 2021

(65) Prior Publication Data
US 2023/0185254 A1   Jun. 15, 2023

(51) Int. Cl.
*G05B 13/04* (2006.01)
*G05B 13/02* (2006.01)
(Continued)

(52) U.S. Cl.
CPC ......... *G05B 13/04* (2013.01); *G05B 13/0265* (2013.01); *G06F 30/27* (2020.01); *G06N 7/01* (2023.01)

(58) Field of Classification Search
CPC ..... G05B 13/04; G05B 13/0265; G06F 30/27; G06N 7/01; G06N 20/00
See application file for complete search history.

(56) References Cited

U.S. PATENT DOCUMENTS 5,402,334 A * 3/1995 Pecora .............. H04L 27/001
                                                    380/46
2021/0178600 A1 * 6/2021 Jha .................. B25J 9/1697

OTHER PUBLICATIONS

Alireza Karimi, Hamid Khatibi, Roland Longchamp, Robust control of polytopic systems by convex optimization, Automatica, vol. 43, Issue 8, 2007, pp. 1395-1402 (Year: 2007).*

(Continued)

*Primary Examiner* — Christopher E. Everett
(74) *Attorney, Agent, or Firm* — Gene Vinokur

(57) ABSTRACT

A controller is provided for generating a policy controlling a system by learning a dynamics of the system. The controller is configured to perform steps of acquiring measurement data from sensors arranged on the system, providing, to the memory, a non-linear system model represented by known part of the dynamics of the system and unknown part of the dynamics of the system, collecting states of the system by measuring the dynamics of the system using the sensors of the system based on a nominal policy and a noise term with respect to the states, estimating a sequence of sets of states of the system and sets of control inputs by collecting data of the system, wherein the data includes a collection of system states, applied control inputs and change in system states, wherein each of the control input is computed by the nominal policy and the additional noise term, learning a polytopic system by use of the collected data of the system for approximating the unknown part of the dynamics of the system using a linear probabilistic regression model, estimating an attractor basin of a terminal controller by sampling initial states in a neighborhood of a terminal state and estimating the attractor basin by supervised learning, and generating a polytopic policy using the estimated polytopic system to drive the system to the attractor basin of the terminal controller from an initial state.

22 Claims, 14 Drawing Sheets

(51) Int. Cl.
*G06F 30/27* (2020.01)
*G06N 7/01* (2023.01)

(56) References Cited

OTHER PUBLICATIONS

Wang, LZ., Su, RQ., Huang, ZG. et al. A geometrical approach to control and controllability of nonlinear dynamical networks. Nat Commun 7, 11323 (2016) (Year: 2016).*
Hsien-Keng Chen, Global chaos synchronization of new chaotic systems via nonlinear control, Chaos, Solitons & Fractals, vol. 23, Issue 4, 2005, pp. 1245-1251 (Year: 2005).*

* cited by examiner

500

510

$$\begin{bmatrix} \Delta x(t_1) \\ \Delta x(t_2) \\ \dots \\ \Delta x(t_f) \end{bmatrix}^T = \begin{bmatrix} \Delta x(t_0)^T & \Delta x(t_1)^T & \dots & \Delta x(t_{f-1})^T \\ \Delta u(t_0)^T & \Delta u(t_1)^T & \dots & \Delta u(t_{f-1})^T \end{bmatrix} \begin{bmatrix} A^T \\ B^T \end{bmatrix}$$

520

$$A_1 = A - \kappa \bar{A} \quad A_2 = A + \kappa \bar{A}$$

$$B_1 = B - \kappa \bar{B} \quad B_2 = B + \kappa \bar{B}$$

Fig. 5

Overview of attractor basin of a controller

Overview of TCPPO used in a motor-control system

SYSTEM AND METHOD FOR POLYTOPIC POLICY OPTIMIZATION FOR ROBUST FEEDBACK CONTROL DURING LEARNING

TECHNICAL FIELD

The invention relates generally to system control, and more particularly to methods and apparatus for robust optimization and feedback control for systems with partially known dynamics during learning.

BACKGROUND

While the field of machine learning and artificial intelligence has seen ground-breaking improvements in the last decade, these techniques find limited applications when it comes to physical or robotic systems. For example, most of the robotic systems still use classical model-based approaches for control of complex processes. This can be attributed to some undesirable features that characterizes most of the existing learning approaches like lack of robustness or poor sample efficiency. Guaranteeing robustness during learning for control of physical systems is important as (learning) models which accurately represent physical dynamics are rare.

Reinforcement learning (RL) is a learning framework that addresses sequential decision-making problems, wherein an 'agent' or a decision maker learns a policy to optimize a long-term reward by interacting with a typically unknown environment. At each iteration or time-step, the RL agent obtains evaluative feedback (called reward or cost) about the long-term performance of its action, allowing it to improve the performance of subsequent actions.

Model-free reinforcement learning (RL) methods have gained widespread popularity due to their ability to construct control policies without the need for a complex dynamical model. However, a majority of model-free RL algorithms cannot incorporate crucial systemic properties such as robustness to exogenous disturbances or even asymptotic stability. Conversely, model-based RL (MBRL), in which these desired properties can be instilled, rely heavily on the underlying dynamical model and exhibit poor performance when model mismatch is large, sometimes even leading to catastrophic failure. This problem is very relevant to a lot of different scenarios where knowledge of the true dynamics is very difficult. This applies to a lot of robotic systems where the robots are supposed to interact with novel objects during run time and thus can not have prior models of interaction.

During policy optimization phase of a MBRL technique, the optimization method should allow incorporation of uncertainties in the learned models, and ensure robustness of the resulting controller for control of the partially known systems. This is generally challenging to achieve. This is a problem that requires knowledge and representation of uncertainties present in system dynamics as well as exploitation of the uncertainty in the policy optimization step. However, it is required for a lot of different application to learning controllers in areas like robotics, autonomous driving, etc.

Most of the techniques for learning-based controller design struggle with poor performance when implemented on the system because one cannot guarantee in a principled manner convergence of the system to a desired system state during learning. Prior work in designing stabilizing controllers for non-linear systems have used the concept of basin (or region) of attraction of controllers to ensure convergence and stability of non-linear systems. See, for example, Tedrake, Russ, et al. "LQR-trees: Feedback motion planning via sums-of-squares verification." The International Journal of Robotics Research 29.8 (2010): 1038-1052. Computing region of attraction for non-linear controllers could be infeasible during the learning phase due to uncertainty in the learned model. However, one may not need to design region of attraction to cover the entire state-space of the robot. It might be sufficient to design a terminal controller with a known region of attraction. Then the control problem can be divided into the tasks of robustly moving the system to the attractor basin of a terminal controller which can then regulate the system state at the desired terminal state.

With this understanding, it is important that one can design a controller that can incorporate the system dynamics uncertainty during controller design and reliably move the system from an initial state to the attractor basin of a terminal controller. However, incorporation of uncertainty during controller design requires that one should be able to estimate and represent the uncertainty in a way that is suitable for controller computation.

To guarantee that a dynamical system always converges to a desired terminal state, we need to design a terminal controller that guarantees regulation of the system to the desired terminal state as the system gets to the terminal basin of the system. Estimating the attractor basin for a controller for non-linear systems is generally a very difficult problem, both computationally and algorithmically. However, efficient estimation of attractor basin of a controller can allow us to stabilize and learn quickly a desired behavior.

Thus, there is a need for robust policy optimization and controller design techniques that can exploit suitable representation of uncertainty during model learning and design a controller to robustly control a system for desired performance during learning.

SUMMARY

It is an object of some embodiments to provide a system and a method for data-driven robust optimization of control policy for systems with partially known dynamics during learning. Additionally or alternatively, it is an object of some embodiment to provide such a system and method that can learn a polytopic representation of uncertainty for a partially known system. Additionally or alternatively, it is an object of some embodiment to provide a system and method that can perform robust optimization using the polytopic uncertainty representation with local stability guarantee to compute robust polytopic controller. Additionally or alternatively, it is an object of some embodiment to provide a system and method that can learn the region of attraction for a terminal controller for the underlying system. Additionally or alternatively, it is an object of some embodiment to provide a system and method that controls the underlying dynamical system using the terminal controller in the region of attraction of the terminal controller and the polytopic controller elsewhere.

Some embodiments of the present disclosure provide a novel robust policy optimization mechanism that can tackle model mismatch by learning polytopes within which the residual (unmodeled components of the real dynamics) system likely resides. This polytopic overapproximation of the residual dynamics, based on Bayesian regression, enables the construction of robust policies by solving tractable semidefinite programs (SDPs).

According to some embodiments of the present disclosure, a novel computer-implemented method is provided for learning robust policies for model-based reinforcement learning by representing model uncertainties using Bayesian polytopes that are learned directly from data. The algorithm of the method allows input and state constraint satisfaction. Further, the novel method is arranged into a polytopic controller has local stability guarantees under an assumption of the learned Bayesian polytope. As an example of designing a robust polytopic controller is described in the present disclosure, which estimates the catch basin of the terminal controller leads to better data efficiency and guaranteed stability.

This throw policy is learned from system output data and it's role is to propagate the system dynamics towards the specified target state. At the target state, we employ a catch policy and leverage supervised learning to estimate a corresponding capture basin within which any state is guaranteed (with high probability) to be stabilizable to the target state. Therefore, when the throw policy drives a state to within this capture basin, the catch policy drives the system to the target state. A major advantage of our approach is that we can also incorporate state and input constraints. The proposed algorithm is demonstrated on an inverted pendulum and an underactuated acrobat system.

Some embodiments are based on the realization that inaccuracies in the dynamic model of a system leads to compounded errors in the prediction for the dynamical system which is used for designing a controller for the dynamical system. In order to achieve desired behavior of the dynamical system with inaccurate dynamical models, one generally needs to quantify the inaccuracy and then use the estimate of inaccuracy in controller design in order to be able to compensate for these inaccuracies during operation.

Some embodiments of the current disclosure are based on the realization that for most physical models, a predictive model is available either using domain knowledge or could be created using physics engines. These models are generally inaccurate and do not match the physical observation from the real system exactly. However, these models can be used to compute an initial controller for controlling the real system. Some embodiments are based on the realization that such a controller will result in poor performance on the real system but can be used to collect data from the real system. This data can be then used to improve the predictive model for the real system.

Some embodiments of the current disclosure are based on the realization that the data collected from the real system using a controller can be used to compute the difference between the observations between the real system and the model of the system. The difference between the real system and the known model of the system can be learned from the collected data using a machine learning model. Some embodiments of the current disclosure is based on the realization that it is possible to quantify the uncertainty of machine learning models in different ways using different representations for the same.

Some embodiments of the current disclosure are based on the realization that using a linear representation or polytopic representation for the uncertainty can allow us to use tools from Semi-Definite Programming (SDP) to design a robust feedback controller for the dynamic model with known uncertainty. Such a robust controller can be designed while guaranteeing local robustness to model uncertainties. Some embodiments of the current disclosure are based on the realization that a polytopic representation for uncertainty in learned model could be obtained using linear Bayesian optimization and a pre-defined confidence interval for the predictions by the Bayesian regression method.

Some embodiments of the present disclosure are based on the realization that it may not be possible to correct the dynamic model of a system in parts of state-space where the system can not reach. Up on implementation of a computed control trajectory, the error between the observed states and the computed nominal trajectory compounds with the horizon of the trajectory. Consequently, the system never visits the neighborhood of the desired terminal state. Some embodiments are based on this realization and thus we design a terminal controller which regulate the system state to the desired system state to the terminal state once the system enters the attractor basin of the terminal controller.

Some embodiments of the current disclosure are based on the realization that most dynamical systems would need a stable terminal controller to ensure that a dynamical system could be regulated and stays at the desired terminal state for the system. However, apart from a terminal controller one needs to estimate the attractor basin for the terminal controller where the terminal controller is guaranteed stable. Some embodiments of the current disclosure are based on the realization that a terminal controller for a dynamical system could be designed using a model-free or model-based fashion depending on whether the model at the terminal state of the system is known. If the model at the terminal state is not known, a terminal controller can also be computed using the model-free approaches like the proportional, integral and derivative (PID) controller.

Some embodiments of the current disclosure are based on the realization that the attractor basin for a terminal controller could be estimated by sampling states from a neighborhood around the terminal state and training a classifier to predict whether the sampled state could be regulated to the desired terminal state. Such a learning process could be designed by first sampling states in a neighborhood of the terminal state and then observing the steady state convergence behavior of the system to the desired terminal state. After collecting data and the convergence labels from initial states, a classifier can be trained to predict the convergence from any initial state, thus providing an estimate of the attractor basin of the terminal controller.

Some embodiments of the present disclosure are based on the realization that the final controller design uses the robust, SDP-based controller to push the system state to the attractor basin of the controller and then uses the terminal controller as predicted by the learned classifier.

According to some embodiments of the present invention, a controller is provided for generating a policy controlling a system by learning a dynamics of the system. The controller may include an interface controller configured to acquire measurement data from sensors arranged on the system; at least one processor; and a memory having computer-implemented instructions including a model learning module and a policy leaning module stored thereon that, when executed by the at least one processor, cause the controller to perform steps of: providing, to the memory, a non-linear system model represented by known part of the dynamics of the system and unknown part of the dynamics of the system; collecting states of the system by measuring the dynamics of the system using sensors of the system based on a nominal policy and a noise term with respect to the states; estimating a sequence of sets of states of the system and sets of control inputs by collecting data of the system, wherein the data includes a collection of system states, applied control inputs and change in system states, wherein each of the control input is computed by the nominal policy and the additional noise term; learning a polytopic system by use of the collected data of the system for approximating the unknown part of the dynamics of the system using a linear probabilistic regression model; estimating an attractor basin of a terminal controller by sampling initial states in a neighborhood of a terminal state and estimating the attractor basin by supervised learning; and generating a polytopic policy using the estimated polytopic system to drive the system to the attractor basin of the terminal controller from an initial state.

Further, according to some embodiments, a computer-implemented method is provided for generating a policy controlling a system by learning a dynamics of the system. The steps to be performed based on the computer-implemented method comprise acquiring measurement data from sensors arranged on the system; providing, to the memory, a non-linear system model represented by known part of the dynamics of the system and unknown part of the dynamics of the system; collecting states of the system by measuring the dynamics of the system using the sensors of the system based on a nominal policy and a noise term with respect to the states; estimating a sequence of sets of states of the system and sets of control inputs by collecting data of the system, wherein the data includes a collection of system states, applied control inputs and change in system states, wherein each of the control input is computed by the nominal policy and the additional noise term; learning a polytopic system by use of the collected data of the system for approximating the unknown part of the dynamics of the system using a linear probabilistic regression model; estimating an attractor basin of a terminal controller by sampling initial states in a neighborhood of a terminal state and estimating the attractor basin by supervised learning; and generating a polytopic policy using the estimated polytopic system to drive the system to the attractor basin of the terminal controller from an initial state.

BRIEF DESCRIPTION OF THE DRAWINGS

The present disclosed embodiments will be further explained with reference to the attached drawings. The drawings shown are not necessarily to scale, with emphasis instead generally being placed upon illustrating the principles of the presently disclosed embodiments.

FIG. 5 describes the Bayesian system learned from the data collected using the real and the simulated system, according to some embodiments of the present disclosure;

DETAILED DESCRIPTION

Figure 1A:
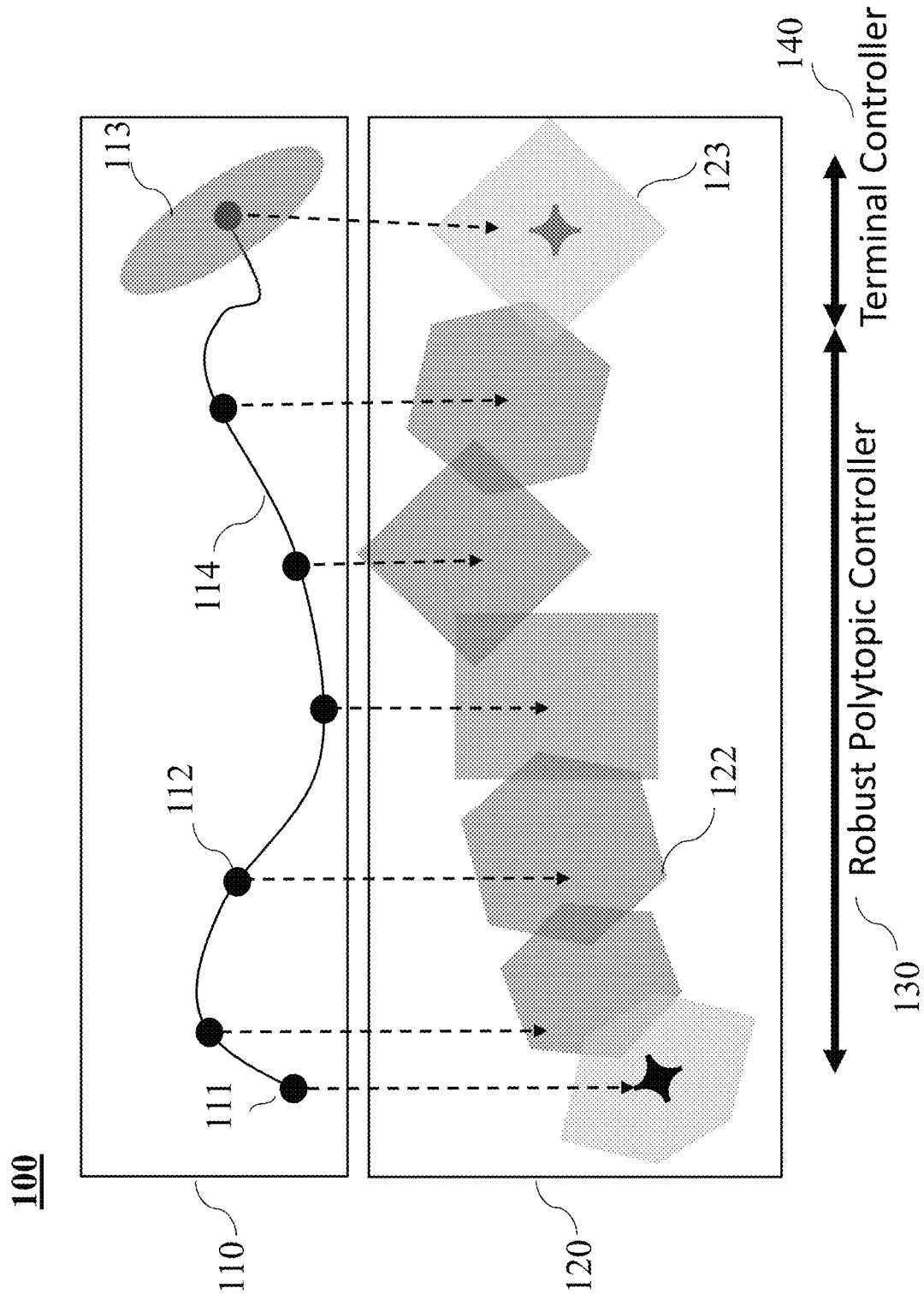
FIG. 1A shows an example of proposed policy optimization method according to some embodiments of the present disclosure.

Various embodiments of the present invention are described hereafter with reference to the figures. It would be noted that the figures are not drawn to scale and elements of similar structures or functions are represented by like reference numerals throughout the figures. It should be also noted that the figures are only intended to facilitate the description of specific embodiments of the invention. They are not intended as an exhaustive description of the invention or as a limitation on the scope of the invention. In addition, an aspect described in conjunction with a particular embodiment of the invention is not necessarily limited to that embodiment and can be practiced in any other embodiments of the invention.

According to some embodiments of the present disclosure, robust optimization for machine learning models with uncertainty is important for learning and design of robust controllers in physical systems. Even though machine learning and artificial intelligence has undergone tremendous progress in the last decade, progress in learning-based control has largely eluded robotics and classical control systems. Reinforcement learning provides a powerful paradigm to learn high performance controllers for physical systems for which creating models from physics is difficult. These tasks are common on robotic manipulation when a robot has to perform frictional interaction to manipulate its environment or when a robot has to react to changes in its environment based on sensory observations. Creating models for such tasks is difficult due to lack of mathematical models or uncertainty in parameters of the known models.

According to some embodiments of the disclosure, most of the model-free reinforcement learning algorithms lack desirable theoretical guarantees of stability and asymptotic convergence that classical, model-based control approaches can provide. On the other hand, performance of model-based reinforcement learning approaches depend on accuracy of models available for control. While highly accurate predictive models might be elusive to learn, modern machine learning models allow to learn uncertainties in the predictive models. These uncertainties capture the noise observed in system evolution due to actuation noise, observation error or the error in the known physics of the underlying system. The uncertainties can be used by a suitably-designed optimizer to design robust controllers to regulate system states close to a desired trajectory to finally converge to the desired terminal state. However, in order to use the uncertainty associated with learned models, the uncertainty needs to be appropriately represented which can then be used by an optimizer. Thus, there are three important steps in design of robust controllers in partially known systems in uncertainty estimation, uncertainty representation and satisfaction of uncertainty constraints during optimization.

Some embodiments of this disclosure divide the controller learning problem for unknown systems in two parts. FIG. 1A shows an example of proposed policy optimization method 100 according to some embodiments of the present disclosure. In this case, the dynamics of the real system is described by the known dynamics and the learned Bayesian polytopes using data collected from the real system. The system operates using the terminal controller when it reaches the region of attraction of the terminal controller of the system, and uses the throw controller when outside of it. The first part of the controller drives the system states to the known terminal region of a terminal controller. This part is known as the throw controller 130. It is noted that the system always starts from a fixed initial state and it has to be regulated to a desired terminal state (or goal state). The second part of the controller 140 is the terminal controller which is activated when the system enters the attractor basin of the terminal controller. The full learning process is denoted as Throw-Catch Polytopic Policy Optimization (TCPPO). An example trajectory 114 of the system in 110 is a sequence of states 112, starting from the initial state 111, that the system goes through to reach a terminal region 113. Some embodiments of the current disclosure learn a polytopic representation 122 of the system dynamics which can be used for robust controller design. Some embodiments of the current disclosure learn a robust polytopic controller 130 to drive the system to the terminal region 113. Some embodiments of the disclosure learn a terminal controller 140 to ensure convergence of the system states to the desired terminal state.

Figure 1B:
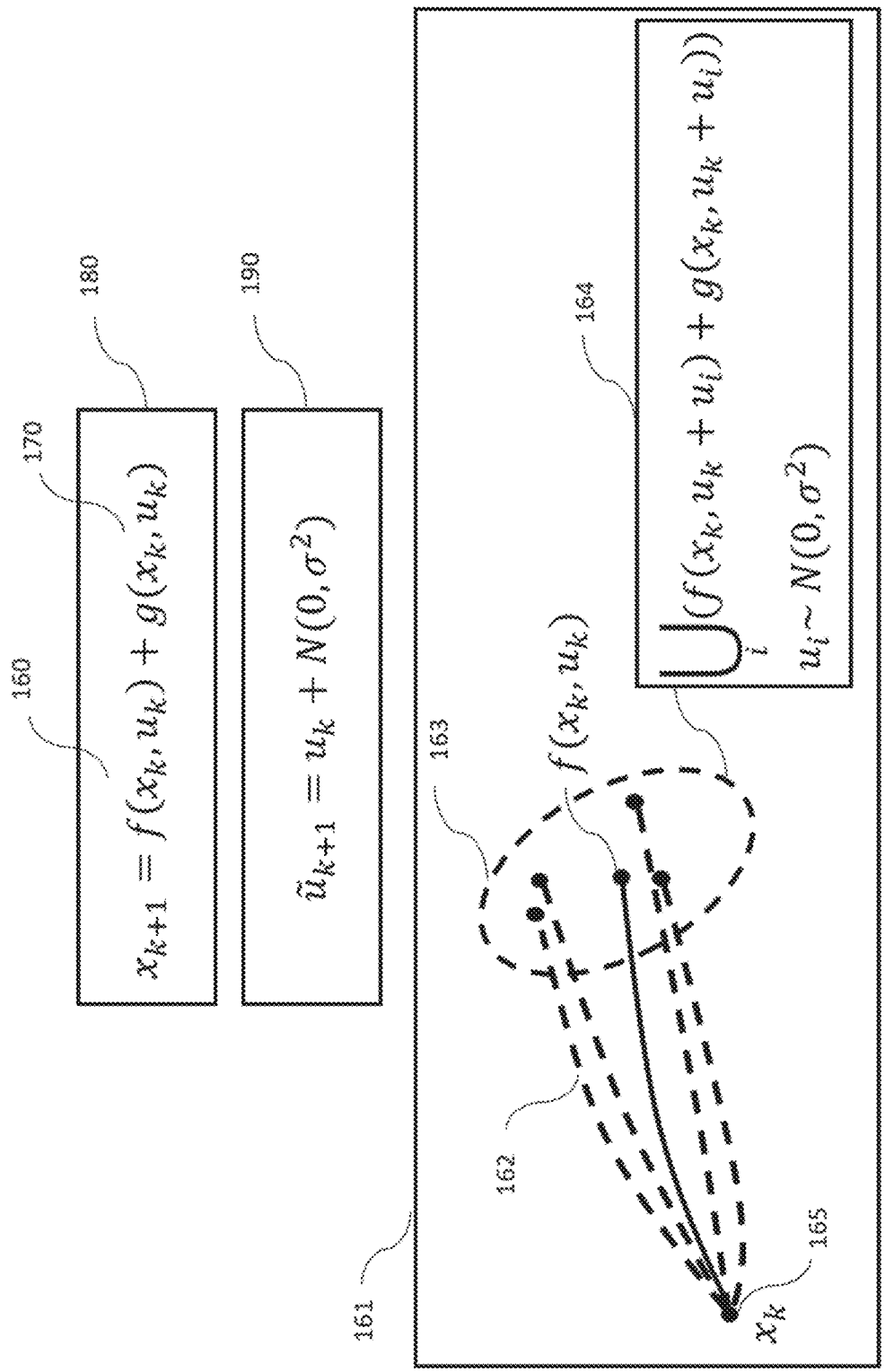
FIG. 1B describes the known and unknown part of the system dynamics and the data collection process in the state space of the system, according to embodiments of the present disclosure.

Some example embodiments disclosed herein relate to problem of learning the unknown dynamics of a dynamical system. FIG. 1B describes the known and unknown part of the system dynamics 180 and the data collection process 161 in the state space of the system, according to embodiments of the present disclosure. In this case, the system evolution 180 consists of the known part 160 and the unknown part 170. The unknown part of the dynamics 170 could be attributed to unmodeled phenomena in a complex system, change of some sub-modules of the system or uncertainty in the parameters of the dynamical model. Learning the residual between the true and the known dynamics could be achieved using a machine learning module that predicts the residual given the current state and a control input to the system.

Figure 2:
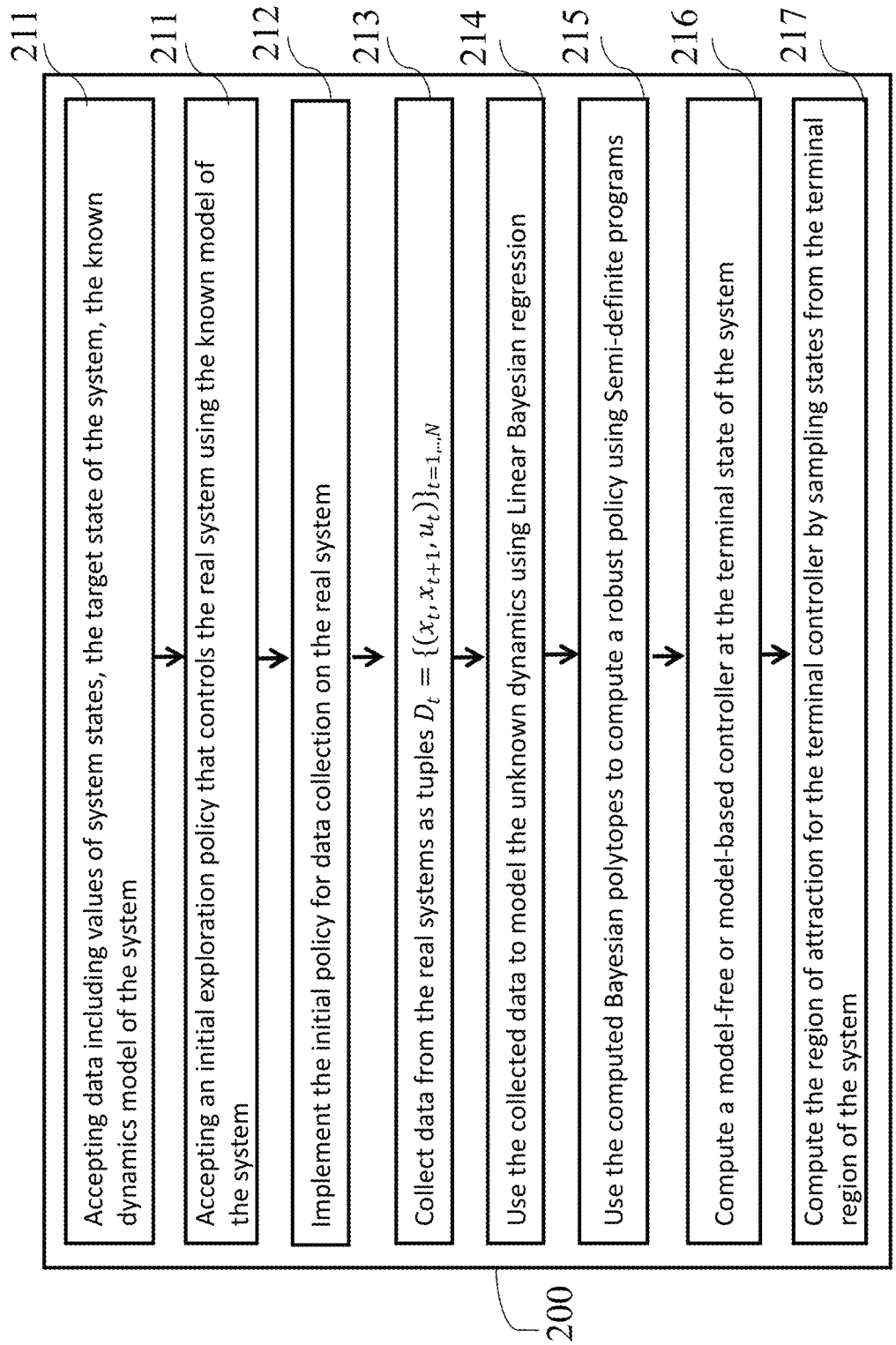
FIG. 2 describes the sequence of steps involved in computing the throw-catch controller using a controlling method, according to some embodiments of the present disclosure.

Some embodiments of the current disclosure that implement a method to learn a controller for the system with partially-known dynamics. FIG. 2 describes the sequence of steps involved in computing the throw-catch controller using a controlling method 200, which can be a computer implemented method (or program module) 200 to collect data consisting of system states, the target state and the known system model 160. This computer implemented method 200 accepts an initial exploration policy 212 using the known system to collect data 213 from the real system. This collected data is used to learn a Bayesian model for the unknown part of the system dynamics (dynamics of the system) 214. This learned model is used to compute a robust policy 215 to drive the system to terminal region of a terminal controller using Semi-definite programming. Certain embodiments of the disclosure design a terminal controller 216 and estimate its attractor basin 217 using sampling and a machine learning method.

Some embodiments of the present disclosure provide a method for performing robust policy optimization for uncertain systems. Consider the following non-linear system (non-linear system model).

$$x_{k+1} = f(x_k, u_k) + g(x_k, u_k) \qquad (1)$$

where $f(\cdot,\cdot)$ and $g(\cdot,\cdot)$ are the known part 160 and unknown part 170 of the dynamics (dynamics of the system) 180, $x \in X \subset R^n$ and $u \in U \subset R^m$. Since in the case considered in this disclosure, the system dynamics is not fully known, we often refer these systems as partially known systems (as the system dynamics is known only partially). There are several examples of non-linear systems. Consider, for example, a robotic system which could consist of a robotic manipulator arm and sensors like encoders or cameras. The state of this system could be represented by the joint angles and velocities of the robotic manipulator and the pose of the object that the robot is manipulating. The system dynamics represents the relationship of change in system states up on application of control inputs to the system (as could be observed from Equation (1)) In Equation (1), $x_k$, $u_k$ is the current state and control input of the system and $x_{k+1}$ is the system state at the next time instant. And the relationship of transition of the system from the current state to the next state up on application of the control input is represented by the system dynamics. For most of the systems (including robotic systems) this relationship is non-linear in state and input, and thus leads to the non-linear system dynamics. These states could be measured using encoders and cameras in the system. The control input for this system could consist of the torques applied at all the joints of the robotic manipulator or the force applied by the manipulator at the object being manipulated. A trajectory of the system state is the sequence of system states which over a certain time horizon. Similarly, a control trajectory is the sequence of control inputs over the same time horizon. The state trajectory could be represented by the sequence $\{x_0, x_1, \ldots, x_T\}$. Similarly a control trajectory is represented by the sequence $\{u_0, u_1, \ldots, u_T\}$. We denote the real 180 and sim 160 as the full model and the known model respectively. Consequently we denote the states observed for these two systems as $x_{real}$, $x_{sim}$, $u_{real}$ and $u_{sim}$. These kind of problems have become very popular in robotics and artificial intelligence problems and are being actively studied as sim2real problems. The key aspect of these problems is to compute policies on the sim system and transfer it to the real system with minimum finetuning to achieve data efficiency. Our problem is also related with these class of problems where the function $f(\cdot,\cdot)$ 160 can be assumed to be the known simulator for the system and the purpose is to design a learning system that can quickly adapt to the real system by learning a suitable representation for the model mismatch and a controller that can compensate for the same.

Some embodiments of the current disclosure make the standard assumptions that the functions $f$ 160 and $g$ 170 are smooth and Lipschitz continuous. The objective is to learn a policy $\pi$ to drive the system from an initial state $x_0$ 111 to a terminal state $x_{goal} \in X_G$ 113 such that $x \in X \subset R^n$ and $u \in U \subset R^m$ are always satisfied. We denote the nominal policy using the known model of the system $f(\cdot,\cdot)$ as $\pi_{nom}$. The presented work is based on certain assumptions for the system around the terminal region.

Some embodiments of the current disclosure 161 design an exploration policy for data collection to learn the robust policy. The proposed method consists of three steps: first we collect data using $\pi_{nom} = \varepsilon$, 190 where $\varepsilon$ 190 is Gaussian distributed noise (noise term) that is added to the nominal policy to perturb the real system 161. Given an initial state $x_k$ 165 of the system, the system uses a control 190 using the nominal policy which is perturbed using noise sampled from Gaussian distribution 190. This results in a distribution 163 of states at the next time instant. Thus using an excitation policy, some embodiments capture the evolution of system dynamics 164 which is used during a model-learning process. The data collected is a collection of system states, the applied control inputs, and the change in system states up on application of the control input.

Some embodiments disclosed in this invention relate to the problem of estimating the uncertainty in the learned predictions of the residual system dynamics. Estimating uncertainty for the learned residual dynamics allows to design (generate) a robust controller by considering the worst case residual dynamics between the true and the known system dynamics. The uncertainty associated with the learned residual dynamics can be estimated by modeling the residual as a probabilistic function of the input variables. The probabilistic machine learning model can then be used to represent the uncertainties in the predictions for the residual dynamics.

Figure 3:
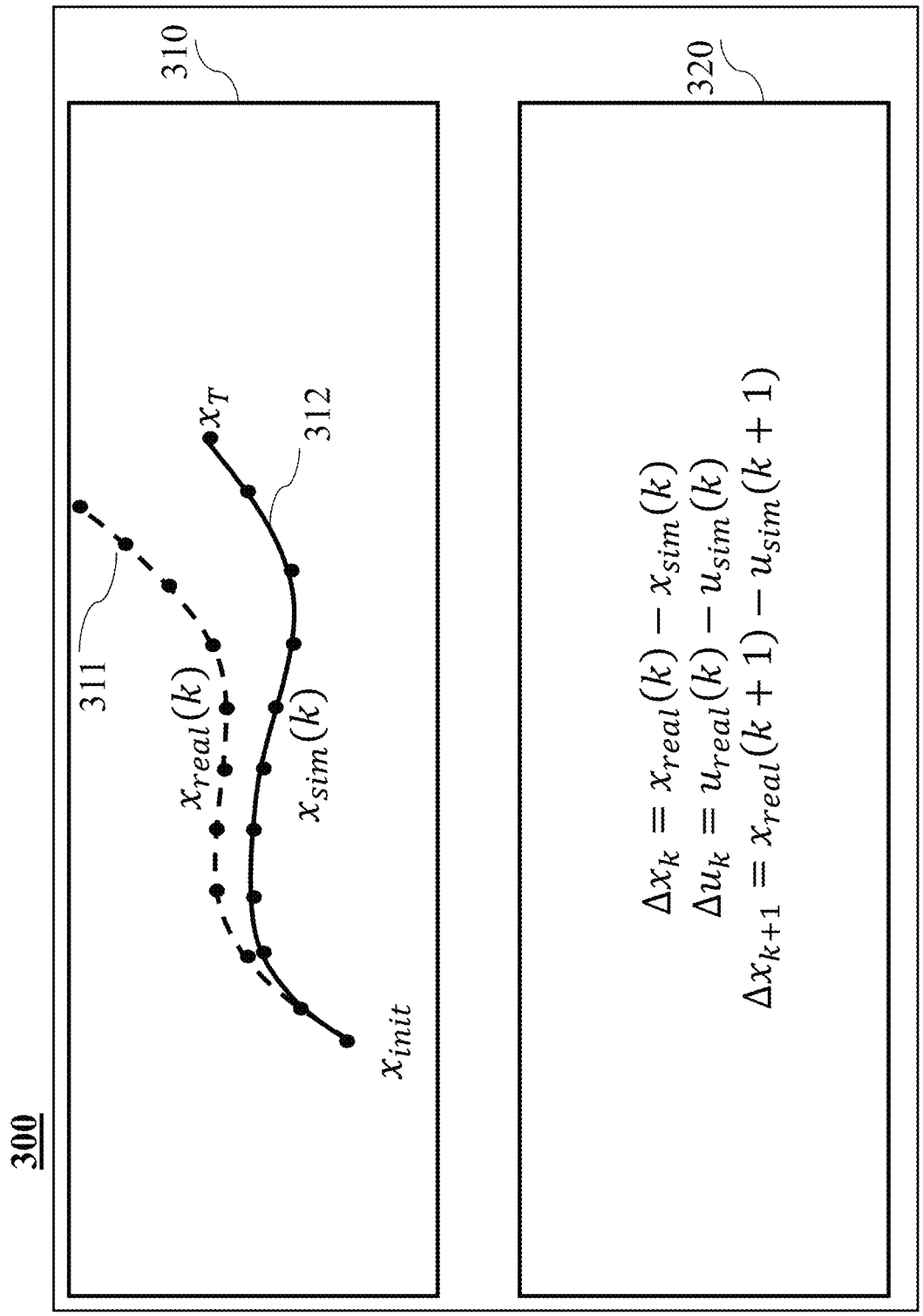
FIG. 3 describes the system trajectory for the real system and the known system, according to some embodiments of the present disclosure.

Some embodiments of the current disclosure presents a method to learn a polytopic representation 122 for uncertainty in the unknown part 170 of the model. It is important to understand that the polytopes that we learn represent the bounds of variation of the system dynamics (and not for the states) as learnt from data. To learn this, we collect data using $\pi = \pi_{nom} + \varepsilon$, where $\varepsilon$ is a noise term added to the nominal policy during exploration. This policy is implemented on the real system to estimate the unknown function $g(\cdot,\cdot)$. FIG. 3 describes the system trajectory 300 for the real system and the known system, according to some embodiments of the present disclosure. Due to the unknown part of the system dynamics, there is a discrepancy 310 between the designed system trajectory 310 and the observed system trajectory 312 upon the application of the computed control signal.

Some embodiments of the current disclosure measure and record this discrepancy between the designed and observed system trajectories. Some embodiments of the current disclosure denote this as the error dynamics 320 between the simulated and the real system, $$\Delta x(k) = x_{real}(k) - x_{sim}(k)$$

$$\Delta u(k) = u_{real}(k) - u_{sim}(k)$$

$$\Delta x(k+1) = x_{real}(k+1) - x_{sim}(k+1) \quad (2)$$

Then the system of equations (2) represents the error dynamics 320 between the real 180 and sim 160 systems. The system represented by (2) is also known as the residual dynamics between the real and simulated system as this is the part of the dynamics that could not be explained by the simulated system (or the known part of the dynamical system). This system is then approximated using a polytopic description 500 using Bayesian regression. That is, some embodiments of the disclosure use data trajectories collected up within the time instants $t_0, t_f \in N$ comprised of $D(t_0, t_f) := \{\Delta x(k), \Delta u(k), \Delta x(k+1)\}_{t_0}^{t_f}$ to estimate a polytopic system which contains the true linear system representation with quantifiable uncertainty based on confidence-bounds. Once this data is collected, some embodiments of the current disclosure use Bayesian Ridge regression (which is a linear probabilistic regression model) to approximately learn the error system represented in (2). More concretely, the linear error dynamics system for (2) could be modeled as $\Delta x(k+1) \approx A_0 \Delta x(k) + B_0 \Delta u(k)$. Then, the regression problem we consider is to learn the matrices $A_0$ and $B_0$ using the data $D(t_0, t_f) := \{\Delta x(k), \Delta u(k), \Delta x(k+1)\}_{t_0}^{t_f}$. Using Bayesian regression, we estimate a Gaussian distribution for each of the element of the matrices $A_0$ and $B_0$. This is solved by maximizing the corresponding log marginal likelihood, and this provides a Gaussian distribution over the system parameters for the error dynamics in (2). This probabilistic system is then used to construct a polytopic error system using confidence intervals of the estimated probability distributions and this is consequently used for designing a robust polytopic controller. The intuition is that the error dynamics could lie within this polytopic system and this allows us to design controllers with stability guarantees.

Certain embodiments of the current disclosure present a policy optimization technique considering the polytopic representation 500 of the uncertainty in the unknown part of the system dynamics. A local linear approximation to the $\Delta x(k+1)$ dynamics can be written as $$\Delta x(k+1) \approx A_0 \Delta x(k) + B_0 \Delta u(k),$$

where $A_0$ and $B_0$ can be estimated using one of many system identification methods, or linearization via automatic differentiation with known/estimated model information. However, all these methods result in a point estimate of A and B, and does not quantify the uncertainty on these estimates. Quantifying the uncertainty on the linear representation results in a polytopic description of the form $$\Delta x(k+1) = A \Delta x_k + B \Delta u_k, \quad (3)$$

with $A \in P(A_1, A_2)$ and $B \in P(B_1, B_2)$, where $P(A_1, A_2)$ denotes a system matrix polytope delineated by the vertices $A_1$ and $A_2$, and $P(B_1, B_2)$ denotes an input matrix delineated by the vertices $B_1$ and $B_2$.

For more clarity into the polytopic description, we provide the following definition and example. A nonlinear system is referred to as a polytopic system if it can be expressed as $$x(k+1) = A(x_k) x_k + B(x_k) u_k,$$

where $A(x) = A_0 + \kappa(x)\bar{A}$ and $B(x) = B_0 + \kappa(x)\bar{B}$ for some constant matrices $A_0, B_0, \bar{A}, \bar{B}$ and some state-dependent scalars $\kappa(x)$ which is bounded above and below by some scalars $\bar{\kappa}, \underline{\kappa}$; that is $\underline{\kappa} \leq \kappa(\cdot) \leq \bar{\kappa}$. For example, consider the nonlinear system $$x(k+1) = Ax(k) + Bu(k) + \begin{bmatrix} 0 \\ \gamma_0 \sin(x_1(k)) \end{bmatrix} u_k,$$

for some $x \in R^2$, system matrices A and B, and $\gamma_0 \in R$. We can rewrite this system in polytopic form as $$x(k+1) = A(x)x(k) + B(x)u(k),$$

where $A(x)$ A and $B(x) = B + \kappa(x)[0 \ 1]^T$, where $-\gamma_0 \leq \kappa(x) \leq \gamma_0$. The vertex matrices for this example are given by $A_1 = A_2 = A$, $B_1 = B - [0 \ 1]^T$ and $B_2 = B + [0 \ 1]^T$.

Figure 4:
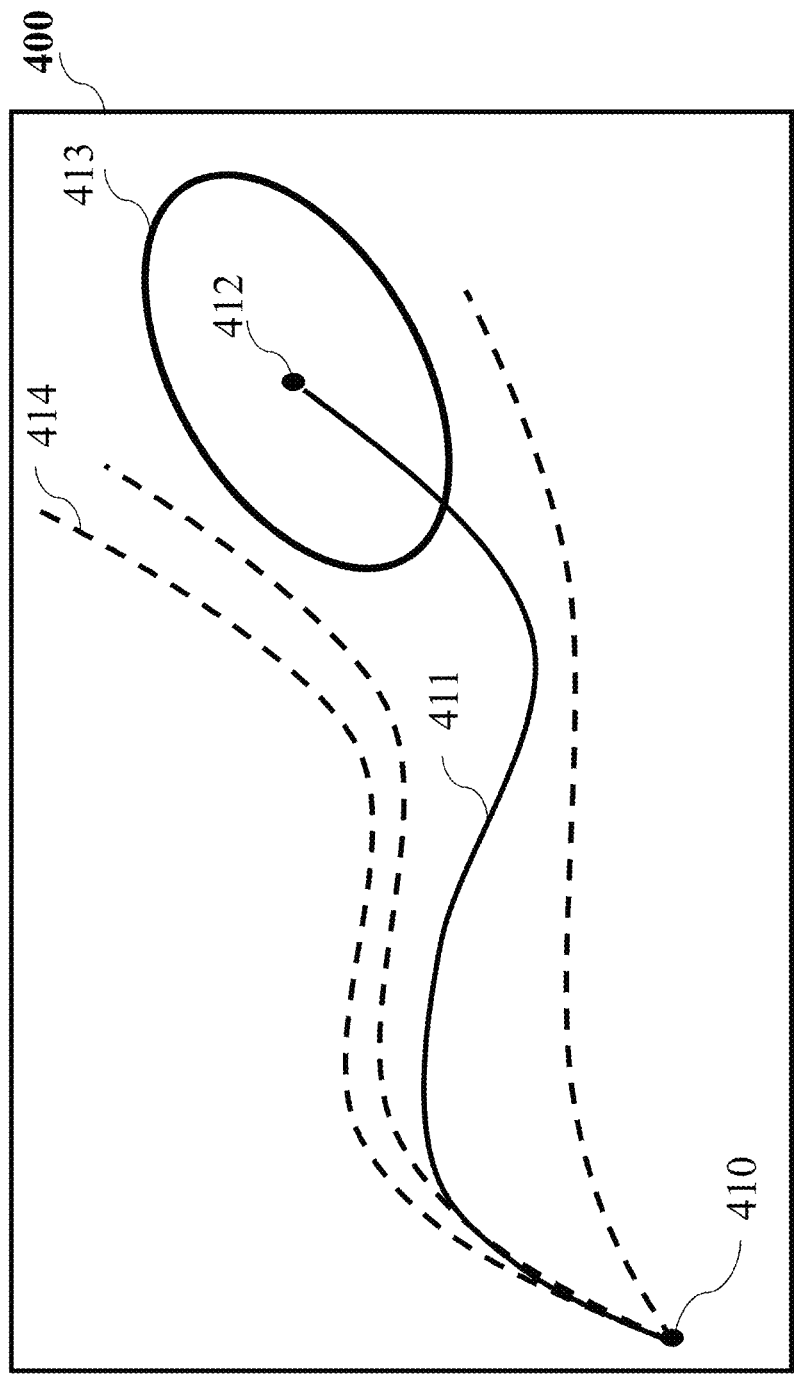
FIG. 4 describes the difference between the designed and the observed trajectory of the system due to the unknown part of the system dynamics.

FIG. 4 describes the difference between the designed and the observed trajectory of the system 400 due to the unknown part of the system dynamics, and FIG. 5 describes the Bayesian system 500 learned from the data collected using the real and the simulated system, according to some embodiments of the present disclosure.

We propose the use of Bayesian regression to obtain the vertex matrices $A_1$, $A_2$ and $B_1$, $B_2$. In particular, we can rewrite (3) as 510

$$\begin{bmatrix} \Delta x(t_1) \\ \Delta x(t_2) \\ \vdots \\ \Delta x(t_f) \end{bmatrix}^T = \begin{bmatrix} \Delta x(t_0)^T & \dots & \Delta x(t_f - 1)^T \\ \Delta u(t_0)^T & \dots & \Delta u(t_f - 1)^T \end{bmatrix} \begin{bmatrix} A^T \\ B^T \end{bmatrix}$$

from which the Bayesian regression algorithm provides $A_0$, $B_0$ as point estimates (the mean) and $\overline{A}$, $\overline{B}$ (the standard deviation), assuming a Gaussian prior: some embodiments of the disclosure refer to this learned polytope as a Bayesian polytope. Choosing a confidence interval yields the vertex matrices 520

$$A_1 := A_0 - \kappa \overline{A} \text{ and } A_2 := A_0 + \kappa \overline{A} \quad (4)$$

and $$B_1 := B_0 - \kappa \overline{B} \text{ and } B_2 := B_0 + \kappa \overline{B} \quad (5)$$

for the Bayesian polytope, where $\kappa \in \mathbb{N}$ denotes the number of standard deviations, and relates to the confidence interval. Empirically, we have found $\kappa \geq 4$ to work well.

The system 400 uses this learned polytopic representation of the system dynamics for generating/computing a robust polytopic policy for driving the system to the terminal set 413. Given the unknown part of the dynamics and the imperfections of the estimates obtained from the machine learning model, a controller which is not robust will not be able to drive the system 400 from an initial state 410 to the desired terminal set 413 for a terminal state 412. A controller that does not consider the uncertainty will diverge resulting in trajectories 414 that can not reach the terminal region.

Once the vertices of the Bayesian polytope are known, the system 400 uses standard convex programming approaches to construct linear state feedback controllers that can provide (local) stability guarantees on $\Delta x$ dynamics, for any linear system that is contained within the Bayesian polytope: that is, any linear system that can be expressed as a convex combination of the vertex matrices $(A_1, B_1)$ and $(A_2, B_2)$.

Next we present a theorem that allows us to compute a robust controller (robust polytopic policy) using the learned Bayesian polytopes and semidefinite programs. If there exists a scalar $\beta > 0$ and matrices $S = S^T \succ 0$ and $Y$ such that i. $\begin{bmatrix} (1-\beta)S & * \\ A_1 S + B_1 Y & -S \end{bmatrix} \preceq 0 \quad (6)$ ii. $\begin{bmatrix} (1-\beta)S & * \\ A_2 S + B_2 Y & -S \end{bmatrix} \preceq 0 \quad (7)$ then the controller $\Delta u = K \Delta x$ with $K = YS^{-1}$ renders the system (3) globally exponentially stable with decay rate $\beta$. Some embodiments of the current disclosure use the above linear matrix inequality (LMI) to design a exponentially stabilizing controller. Some embodiments use the controller gain K derived by solving (6) to find a globally exponentially stabilizing controller for the error dynamics (2).

Some embodiments of the disclsoure design the throw controller given by the following relationship, $u(x) = \pi_{nom}(x) + K \Delta x$, where the feedback matrix K is obtained by solving the Linear matrix inequality in (6).

In order to regulate the state of a dynamical system at a desired terminal state, some embodiments of the current disclosure design a terminal controller that can guarantee convergence of system state to the terminal state. This part of the controller is denoted as the catch controller. However, any regulation controller can guarantee convergence only within its region of attraction. Estimating region of attraction for general non-linear systems is challenging numerically as well as algorithmically. To implement the robust controller explained in this disclosure, the region of attraction of a terminal controller needs to be estimated. Based on this realization, some embodiments of the disclosure estimate the region of attraction 700 for a terminal controller. Region of attraction (or attractor basin) 700 of a controller is the set of the states of a dynamical system that can be driven to the terminal state 710 up on application of the controller via any trajectory 720. The system states inside this set always converge to the state $x_T$ 710 up on action of the controller on any state inside this set.

Some embodiments of the disclosure estimate the region of attraction of the system for the terminal controller. This is based on the assumption that an approximate linear dynamics model for the system at the terminal state of the system. Another possibility is that there is an embodiment of the current disclosure that can implement a terminal controller using classical model-free approaches like proportional-integral (PI) controller on the real system. Both these options complement the throw controller design to regulate the system in the terminal region. We denote the terminal controller by $\pi_{term}$. While there are analytical techniques to estimate the region of attraction of linear systems, estimating region of attraction for non-linear systems is, in general, very challenging. The region of attraction $X_{ROA,\pi}$ 700 for $\pi_{term}$ is the part of the state-space for which the controller $\pi_{term}$ is exponentially stable, i.e., $$x \in X_{ROA,\pi}, \text{ if } \lim_{k \to \infty} \pi_{term}(x_k) = x_{term}, \text{ where } \pi_{term}(x_k) = \pi_{term}^k(x).$$

Figure 6:
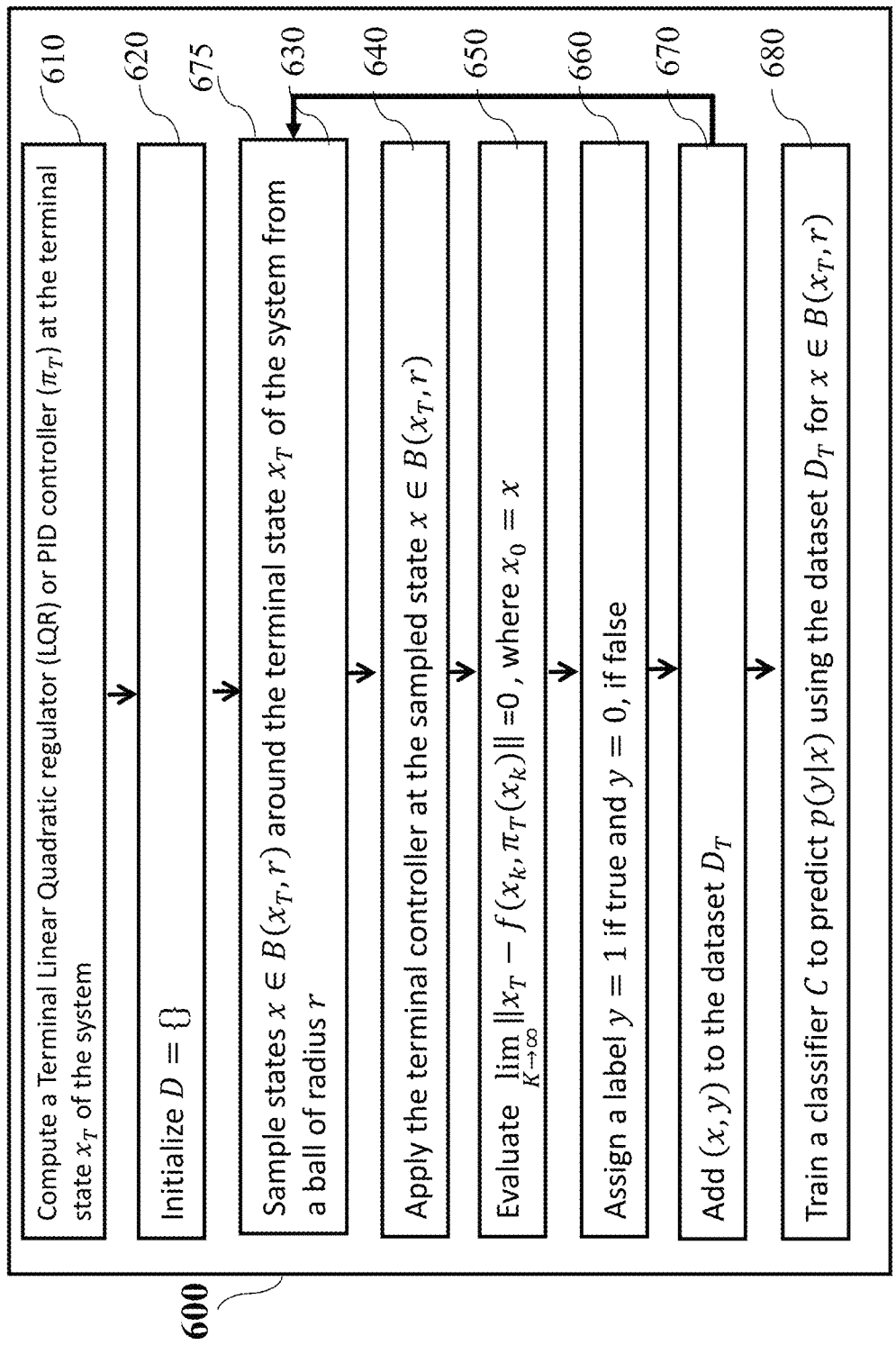
FIG. 6 describes the sequence of steps involved in learning the region of attraction of the system for a given controller by sampling system states under the controlled system and fitting a classifier model to the sampled data, according to some embodiments of the present disclosure.
Figure 7:
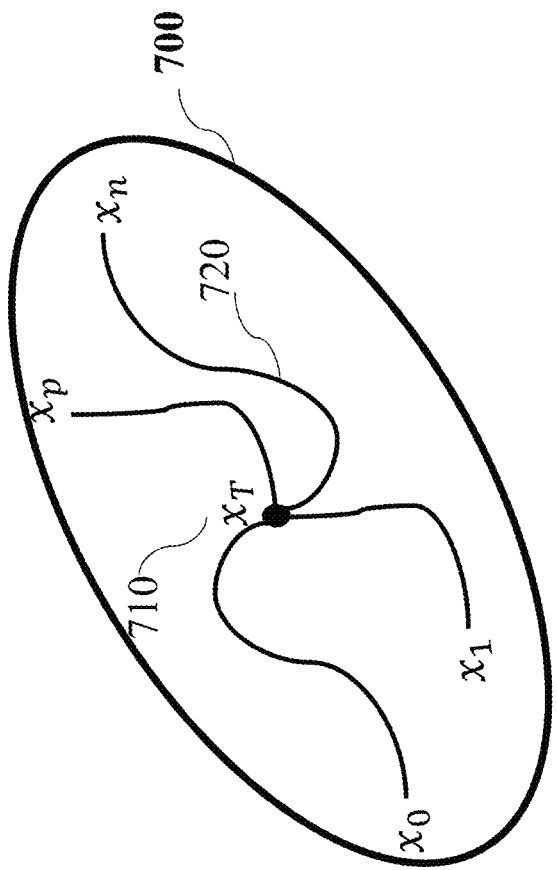
FIG. 7 describes the region of attraction for the terminal controller of the system, according to some embodiments of the present disclosure.

FIG. 6 describes the sequence (computer-implemented method) 600 of steps involved in learning the region of attraction of the system for a given controller by sampling system states under the controlled system and fitting a classifier model to the sampled data according to some embodiments of the present disclosure. Further, FIG. 7 describes the region of attraction for the terminal controller 700 of the system, according to some embodiments of the present disclosure.

To estimate the region of attraction $X_{ROA,\pi}$ of $\pi_{term}$ 610, the method 600 samples random 620, 630 states in a neighborhood around the terminal state 710, and apply the terminal controller to drive the system to the terminal state 640. More formally, we generate labels for training a classifier using the following 650, 660, 670:

$$y(x_0) = 1, \text{ if } \lim_{k \to \infty} \pi_{term}(x_k) = x_{term} \quad (9)$$

$$y(x_0) = 0, \text{ otherwise}$$

The above Equations (9) represent that the region of attraction of $\pi_{term}$ is the set of states for which closed-loop dynamics $f_{real}(x, \pi(x))$ converges to the terminal state, and thus $\pi_{term}$ can regulate the system at the desired terminal state. This data $D=\{(x_0, y)\}$ is used to train a binary classifier 680 that can predict whether a test state $\tilde{x}_0$ is inside the catch basin $X_{ROA,\pi}$ of the controller, and thus is used to activate the controller $\pi_{term}$. It is noted that we assume that our system can be initialized in the state $x_0$ in a close neighborhood of the terminal state $x_{term}$ of the real system.

Figure 8:
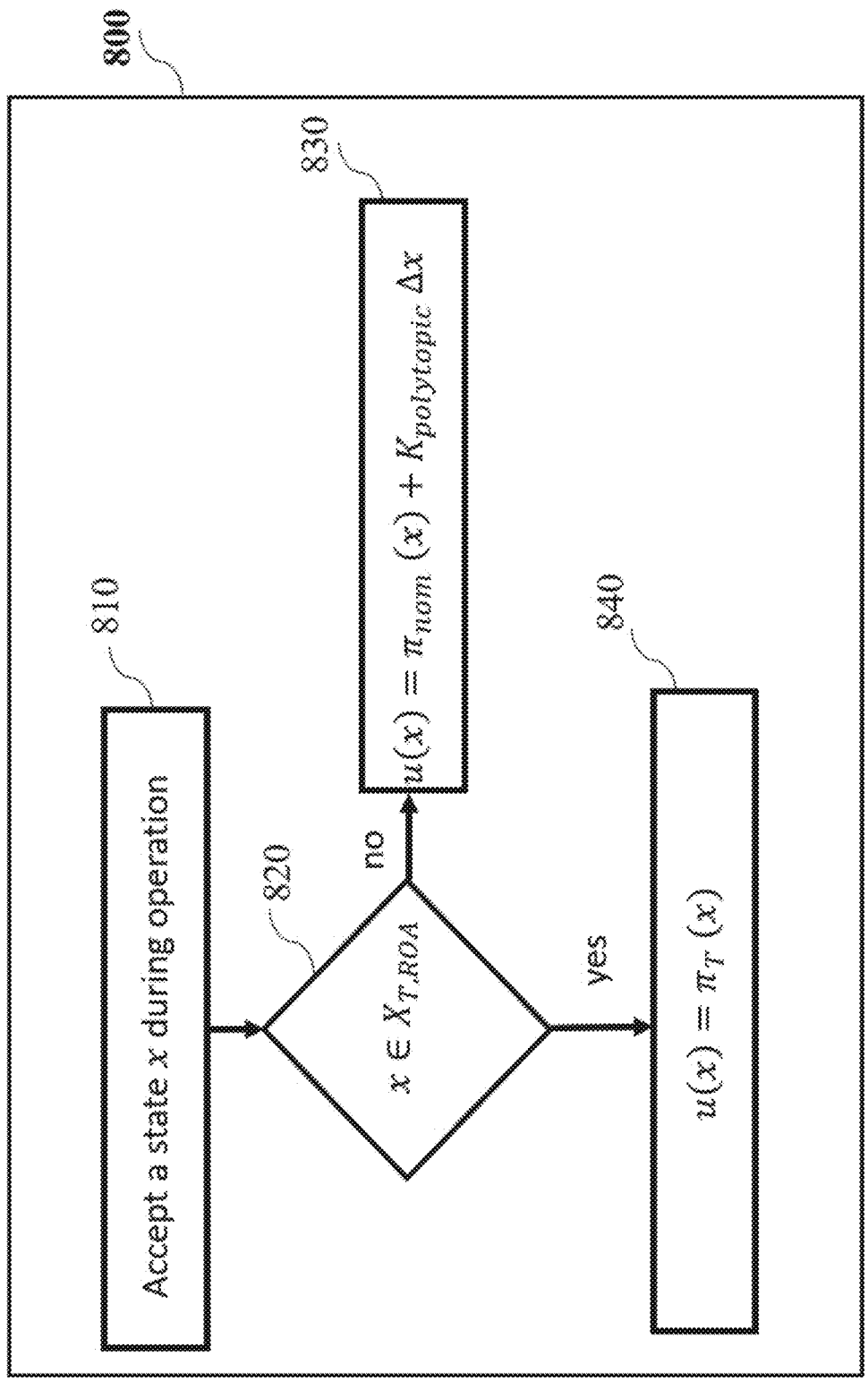
FIG. 8 describes the operations of the system upon computation of the Throw-Catch controller, according to some embodiments of the present disclosure.

FIG. 8 describes the operations of a policy 800 used in the system upon computation of the Throw-Catch controller according to some embodiments of the present disclosure.

With these three parts of the learning process, some embodiments design the proposed policy 800 for systems with model mismatch. More formally, the throw-catch policy is given by the following relationship:

$$u(x) = \pi_{nom}(x) + K\Delta x, \text{ if } x \notin X_{ROA,\pi}$$

$$u(x) = \pi_{term}(x), \text{ if } x \in X_{ROA,\pi} \quad (10)$$

Some embodiments of the disclosure provide a computer-implemented method for implementing the throw-catch policy for the system with model mismatch. This embodiment accepts a system state during operation 810. The trained classifier model can decide 820 whether the current state is in the region of attraction of the terminal (catch) controller. If the state is inside the terminal region 840, then the terminal controller is implemented on the system. Otherwise, the robust polytopic controller (or the throw controller) is implemented 830. It is noted that as equation (10) suggests, the final control policy for the system is a hybrid control policy which uses different controllers in different parts of state space.

Figure 9:
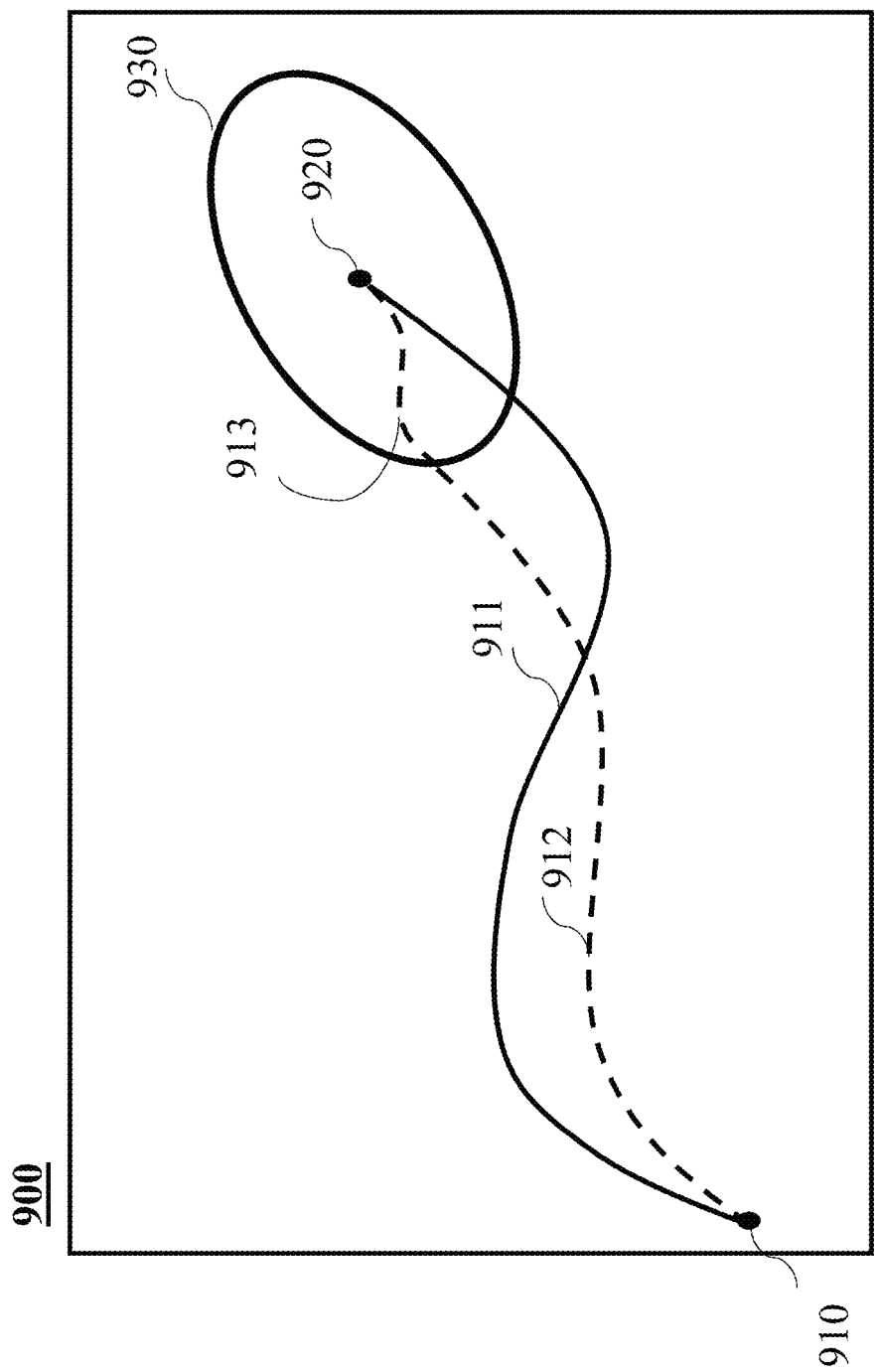
FIG. 9 shows the implementation of the computed robust control on the system where the terminal controller is implemented as the system enters the attractor basin of the terminal controller, according to some embodiments of the present disclosure.

FIG. 9 shows the implementation of the computed robust control 900 on the system where the terminal controller is implemented as the system enters the attractor basin of the terminal controller, according to some embodiments of the present disclosure.

The system behavior could be seen in the computed robust control 900, where the designed nominal trajectory is 911 from the initial state 910. Due to the unknown part of the system dynamics, the observed system trajectory 912 deviates from the designed trajectory. However, due to the robust polytopic controller, the system is driven to the attractor basin of the terminal controller 930. The system is driven to the terminal state 920 using the terminal controller via the trajectory 913.

Figure 10A:
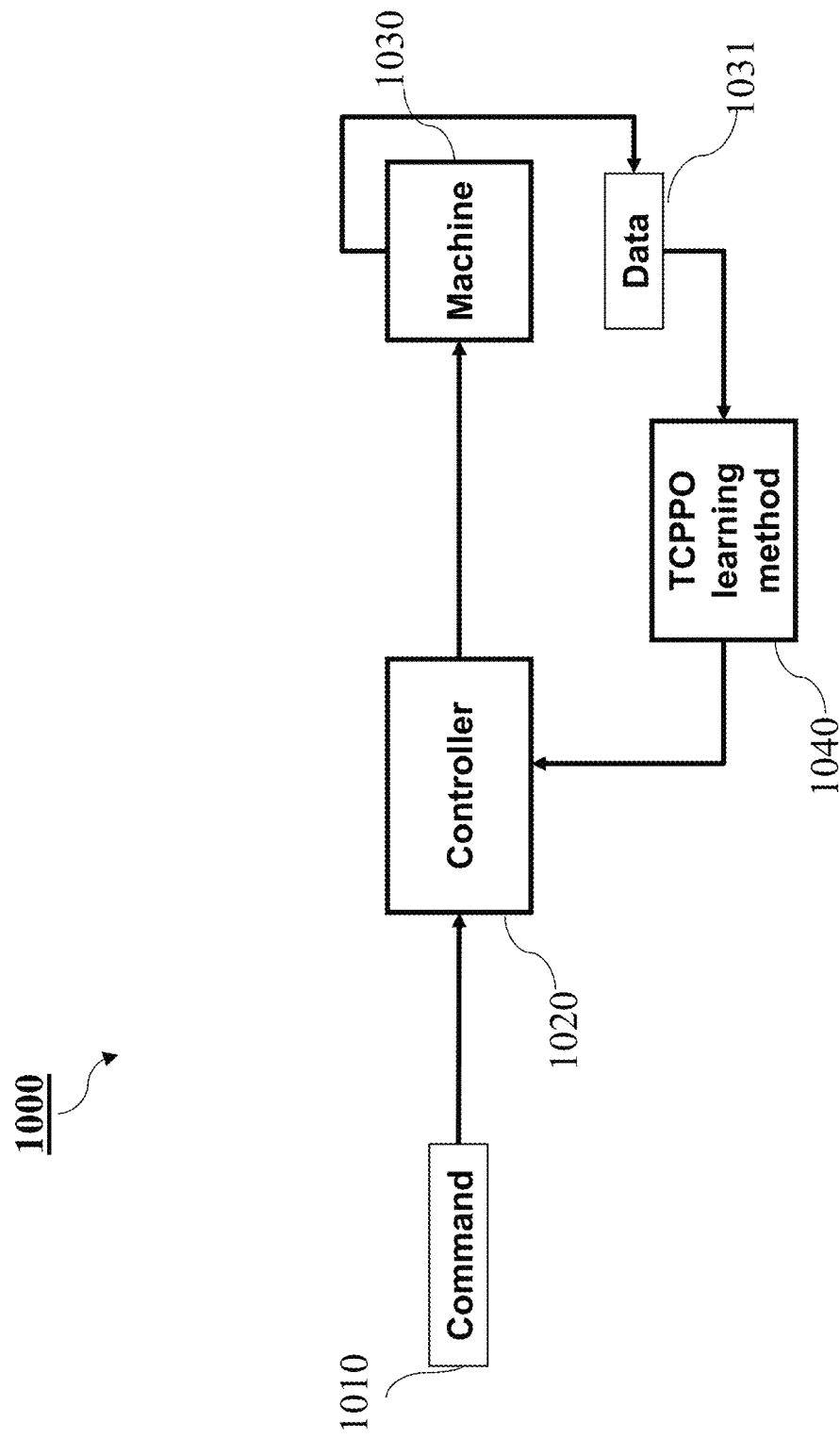
FIG. 10A shows a schematic of the feedback learning system, which shows the different modules of data collection and learning the controller with more data, according to some embodiments of the present disclosure.

FIG. 10A shows a schematic of a feedback learning system, which shows the different modules of data collection and learning the controller with more data, according to some embodiments of the present disclosure.

In this case, the feedback learning system is used for design and control of a motor controller 1000. This system accepts a command (which is the desired goal) 1010 which is provided to the controller 1020. This controller uses a nominal policy to collect exploration data 1031. This data is used by the TCPPO learning method 1040 to compute a new controller. This is then sent back to the controller 1020 which updates the control law to control the machine. This process is repeated till convergence.

Figure 10B:
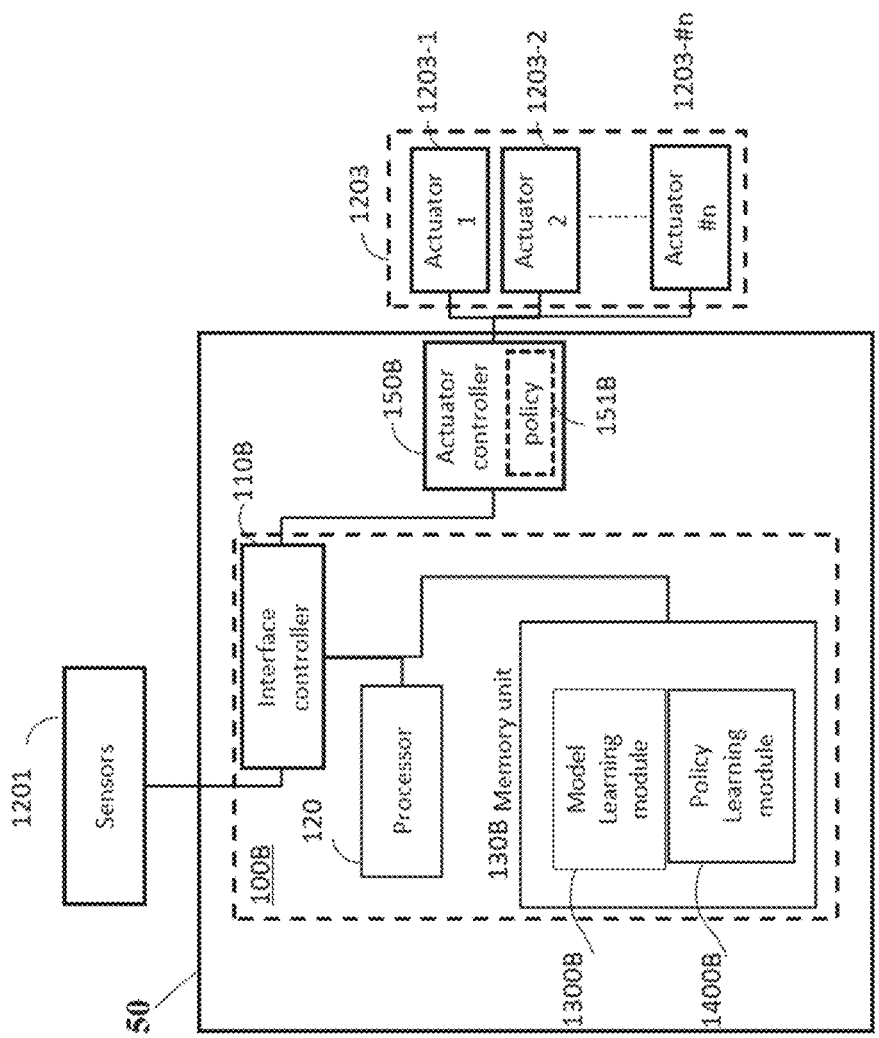
FIG. 10B shows a block diagram to represent a controller including different modules of data collection and learning the controller with more data according to some embodiments of the present disclosure.

FIG. 10B shows a block diagram to represent a controller (robotic control system) 50 including different modules of data collection and learning the controller with more data according to some embodiments of the present disclosure. The robotic control system 50 is configured to control an actuator system 1203 of the robot. In some cases, a robotic controller 100B included in the controller 50 can be a hardware that is configured to connect to an actuator controller 150B for controlling motions of the robot. The robotic controller 100B, which includes a model learning module 1300B and a policy learning module 1400B, is connected to the actuator controller 150B and the robot and sensors 1201 that measure the motions of the robot, in which the sensors 1201 are arranged in the robot to detect states of individual actuators of the robot. Further, the robotic controller 100B generates policy parameters based on measurement data of the motion of the robot, wherein the robotic controller 100B provides the policy parameters to the actuator controller 150B of the robot to update a policy unit 151B of the actuator controller.

The robotic controller 100B, which can be a hardware circuit, may include an interface controller 110B, a processor 120, and a memory unit 130B. The processor 120 may be one or more than one processor units, and the memory unit 130B may be memory devices, a data storage device or the like. The interface controller 110B can be an interface circuit, which may include analogue/digital (A/D) and digital/analogue (D/A) converters to make signal/data communication with sensors 1201 and a motion controller 150B of the robot. Further, the interface controller 110B may include a memory to store data to be used by the A/D or D/A converters. The sensors 1201 are arranged at joints of the robot (robot arm(s)) or picking object mechanism (e. g. fingers) to measure the stats of the robot. The robot includes an actuator controller (device/circuit) 150B that includes a policy unit 151B to generate action parameters to control a robotic system 1203 that controls robot arms, handling mechanism or combinations of the arms and the handling mechanism 1203-1, 1203-2, 1203-3 and 1203-#N, according to the number of joints or handling fingers. For instance, the sensors 1201 may include acceleration sensors, positioning sensors, torque sensors, angle sensors, global positioning system (GPS) device, cameras, depth cameras, range cameras, range scanners or the like to measure motion states of the robot.

The interface controller 110B is also connected to the sensors 1201 that measure/acquire states of the motion of the robot mounted on the robot. In some case, when the actuators are electrical motors, the actuator controller 150B may control individual electric motors that drive the angles of the robot arms or handling of the object by the handling mechanism. In some case, the actuator controller 150B may control the rotations of individual motors arranged in the arms to smoothly accelerate or safely decelerate the motion of the robot in response to the policy parameters generated from the policy learning module 1400B. Further, depending to the design of the object handling mechanism, the actuator controller 150B may control the lengths of the actuators in response to the policy parameters generated from the policy learning module 1400B.

The memory unit 130B can store computer-executable program modules including a model learning module 1300B and a policy learning module 1400B. The processor 120 is configured to perform steps of the program modules 1300B and 1400B. In this case, the steps may include offline-modeling to generate offline-learning states based on the action state (motion states) of the robot and measurement state from the sensors 1201 using the model learning module 1300B. The steps further perform providing the offline states to the policy learning module 1400B to generate policy parameters and updating the policy 151B of the motion controller 150B of the robot to operate the actuator system 1203 based on the policy parameters.

For instance, the measurement data could consist of the angular position of the joints of the manipulator arm or pose of the end-effector of the robot or the pose of the object being manipulated by the manipulator arm. The dynamics of the system can be defined by the relationship between the change in angular position of the joints obtained by applying torques at the individual joints of the robot. It could also be defined by the relationship between the change in the pose of the object up on application of forces on object by the manipulator. The states of the system can be represented by the joint angular position and velocities which could be appended with the objects that are being manipulated by the robot. The states of the system can be measured using encoders or using a vision system (e.g. cameras, depth camera, range scanner) that can be designed to track objects in the environment of the robot. The sets of control inputs are the torques applied by the motors at the individual joints in order to move the joints or the end-effector position. An attractor basin of a terminal controller can be defined by the set of system states in the neighborhood of the terminal state which can be regulated by the terminal controller. In case of the robotic manipulator manipulating an object, the terminal state is the desired pose of the object. A terminal controller could be computed using the classical control methods which ensure the convergence of the object state to the desired state. The attractor basin of the terminal controller is the set of states in the neighborhood of the terminal state where the terminal controller can guarantee convergence.

Figure 11:
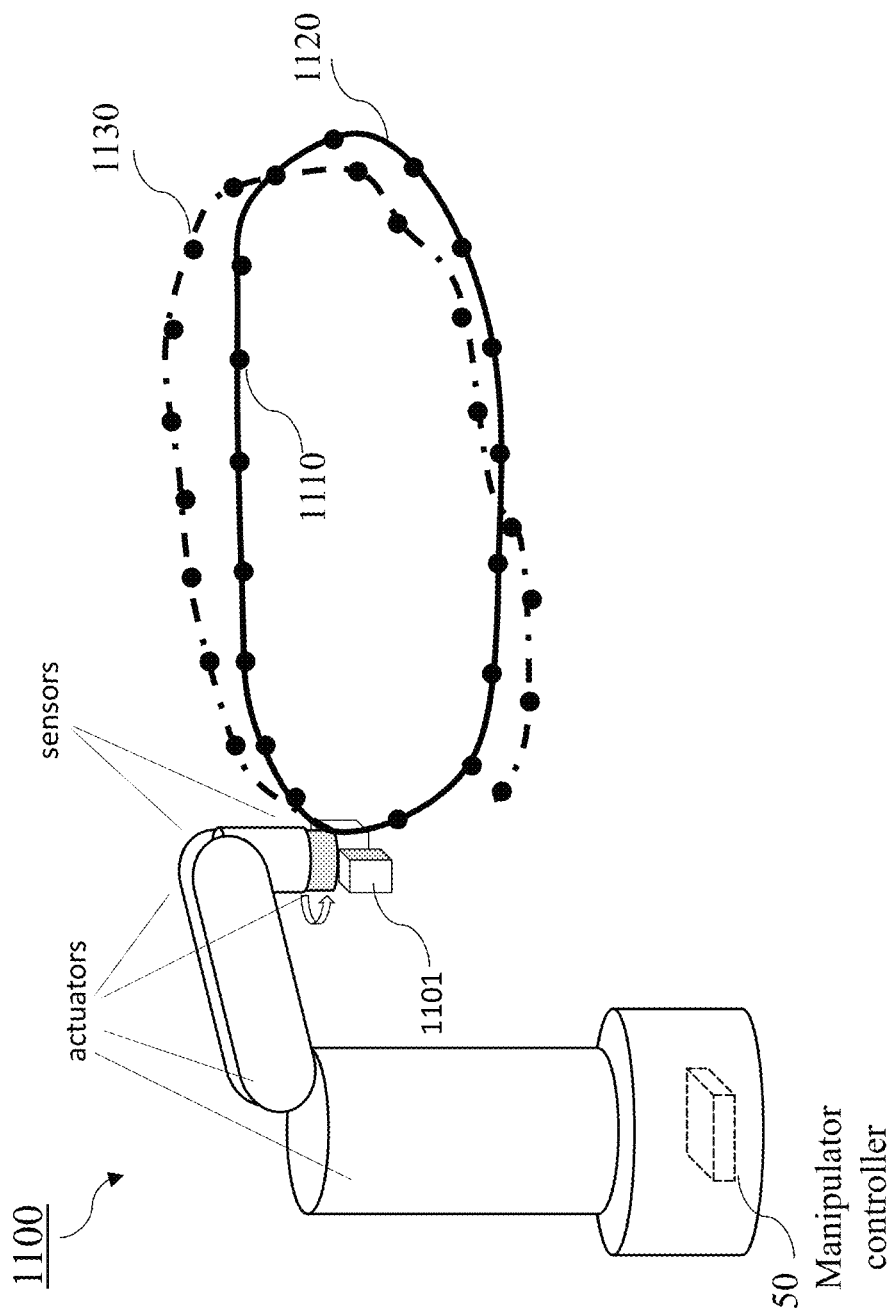
FIG. 11 shows an example of a robotic system, illustrating a manipulator tracking a desired trajectory from an initial state, according to embodiments of the present disclosure.
Figure 12B:
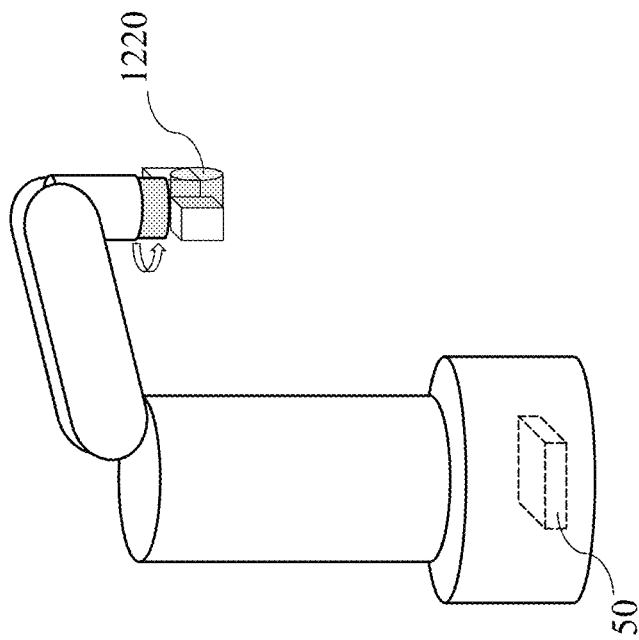
FIG. 12B shows a manipulator of the robotic system manipulating a different workpiece, according to some embodiments of the present invention.
Figure 12A:
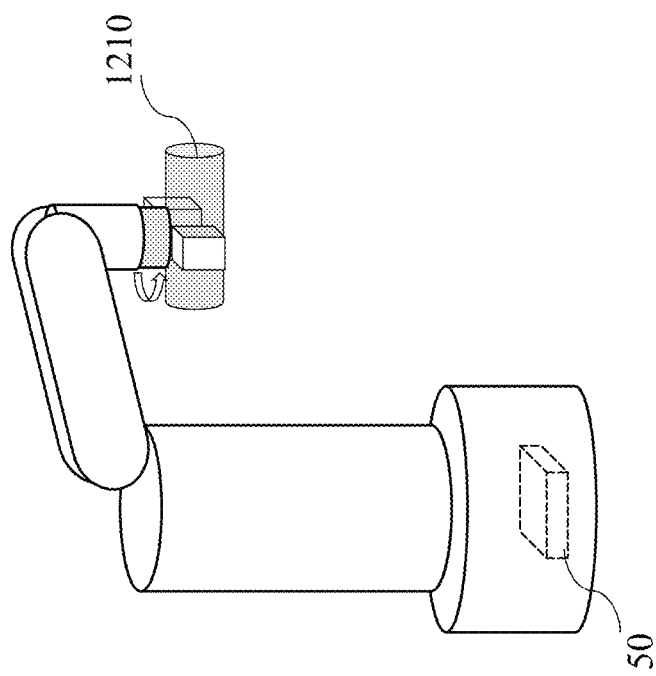
FIG. 12A shows a manipulator of the robotic system manipulating one workpiece, according to some embodiments of the present disclosure.

FIG. 11 shows an example of a robotic system 1100, illustrating a manipulator tracking a desired trajectory from an initial state, according to embodiments of the present disclosure. FIG. 12A and FIG. 12B show a manipulator of the robotic system 1100 manipulating one workpiece 1210 and a different workpiece 1220 according to some embodiments of the present invention. The proposed controller 50 is configured to control the movement of a manipulator arm of the robotic system 1100 with additional unknown load 1101. The manipulator controller 50 sends a control command based on the sensor feedback of the sensors to control the load to follow a desired trajectory 1120. However, due to the unknown load there is some error in the observed trajectory 1130 when compared to the designed trajectory 1120. This problem is solved by using a TCPPO controller in the manipulator controller 50 such that the robot can accurately move different unknown objects 1210 and 1220.

The invention claimed is:

1. A controller for generating a policy controlling a system by learning a dynamics of the system, comprising:
    an interface controller configured to acquire measurement data from sensors arranged on the system;
    at least one processor; and a memory having computer-implemented instructions including a model learning module and a policy leaning module stored thereon that, when executed by the at least one processor, cause the controller to perform steps of:
    providing, to the memory, a non-linear system model represented by known part of the dynamics of the system and unknown part of the dynamics of the system;
    collecting states of the system by measuring the dynamics of the system using the sensors of the system based on a nominal policy and a noise term with respect to the states;
    estimating a sequence of sets of states of the system and sets of control inputs by collecting data of the system, wherein the data includes a collection of system states, applied control inputs and change in system states, wherein each of the applied control inputs is computed by the nominal policy and an additional noise term;
    learning a polytopic system by use of the collected data of the system for approximating the unknown part of the dynamics of the system using a linear probabilistic regression model;
    estimating an attractor basin of a terminal controller by sampling states in a neighborhood of a terminal state and estimating the attractor basin by supervised learning;
    generating a polytopic policy using the estimated polytopic system to drive the system to the attractor basin of the terminal controller from an initial state; and
    controlling a robot arm of the system by providing an action command to actuators of the system based on the polytopic policy, wherein the system is a robotic system.

2. The controller of claim 1, further comprising:
    implementing a hybrid control policy that includes a robust polytopic policy which drives the system to attractor basin of the terminal controller and using the terminal controller to drive the system to a desired terminal state.

3. The controller of claim 1, wherein the controller further generates an exploration policy using the known system model of the system.

4. The controller of claim 1, wherein the controller further collects data from the system by implementing an exploration policy on the system and collecting state trajectories and input trajectories.

5. The controller of claim 1, wherein the controller further learns a residual dynamics between the system and the known system model of dynamics of the system.

6. The controller of claim 1, wherein the controller further collects the data for a residual dynamics as a difference of the state trajectories for a given control trajectory between the system and the known system model.

7. The controller of claim 1, wherein the controller is further uses a probabilistic machine learning model for a residual dynamics using Bayesian Optimization.

8. The controller of claim 1, wherein the controller further estimates a polytopic system for a residual dynamics using a Bayesian model and a predetermined confidence interval.

9. The controller of claim 1, wherein the controller further generates a robust polytopic controller using the polytopic system and semi-definite programming.

10. The controller of claim 1, wherein the terminal controller at the terminal state of the system is generated to drive the system to the desired terminal state.

11. The controller of claim 1, wherein the controller further estimates the attractor basin of the terminal controller using a machine learning-based classification technique.

12. A computer-implemented method for generating a policy controlling a system, by learning a dynamics of the system, comprising:
    acquiring measurement data from sensors arranged on the system;
    providing, to the memory, a non-linear system model represented by known part of the dynamics of the system and unknown part of the dynamics of the system;
    collecting states of the system by measuring the dynamics of the system using the sensors of the system based on a nominal policy and a noise term with respect to the states;
    estimating a sequence of sets of states of the system and sets of control inputs by collecting data of the system, wherein the data includes a collection of system states, applied control inputs and change in system states, wherein each of the control input is computed by the nominal policy and an additional noise term;

learning a polytopic system by use of the collected data of the system for approximating the unknown part of the dynamics of the system using a linear probabilistic regression model;

estimating an attractor basin of a terminal controller by sampling initial states in a neighborhood of a terminal state and estimating the attractor basin by supervised learning;

generating a polytopic policy using the estimated polytopic system to drive the system to the attractor basin of the terminal controller from an initial state; and controlling robot arms of the system by providing an action command to actuators of the system based on the polytopic policy, wherein the system is a robotic system.

13. The computer-implemented method of claim 12, further comprising:

implementing a hybrid control policy that includes a robust polytopic policy which drives the system to attractor basin of the terminal controller and using the terminal controller to drive the system to a desired terminal state.

14. The computer-implemented method of claim 12, wherein the controller further generates an exploration policy using the known system model of the system.

15. The computer-implemented method of claim 12, wherein the controller further collects data from the system by implementing an exploration policy on the system and collecting state trajectories and input trajectories.

16. The computer-implemented method of claim 12, wherein the controller further learns a residual dynamics between the system and the known system model of dynamics of the system.

17. The computer-implemented method of claim 12, wherein the controller further collects the data for a residual dynamics as a difference of the state trajectories for a given control trajectory between the system and the known system model.

18. The computer-implemented method of claim 12, wherein the controller is further uses a probabilistic machine learning model for a residual dynamics using Bayesian Optimization.

19. The computer-implemented method of claim 12, wherein the controller further estimates a polytopic system for a residual dynamics using a Bayesian model and a predetermined confidence interval.

20. The computer-implemented method of claim 12, wherein the controller further generates a robust polytopic controller using the polytopic system and semi-definite programming.

21. The computer-implemented method of claim 12, wherein the terminal controller at the terminal state of the system is generated to drive the system to the desired terminal state.

22. The computer-implemented method of claim 12, wherein the controller further estimates the attractor basin of the terminal controller using a machine learning-based classification technique.

* * * * *